HIGH SPEED SEMICONDUCTOR SWITCHING CIRCUITRY

Filed Feb. 14, 1967

3 Sheets-Sheet 1

MAKOTO WATANABE,
HISAKAZU MUKAI, & KEISUKE KATAOKA
INVENTORS
by Stephen H. Frishauf
Att.

HIGH SPEED SEMICONDUCTOR SWITCHING CIRCUITRY

Filed Feb. 14, 1967 3 Sheets-Sheet 2

BY

INVENTOR.

BY

INVENTOR.

United States Patent Office 3,510,685

Patented May 5, 1970

3,510,685

HIGH SPEED SEMICONDUCTOR SWITCHING CIRCUITRY

Makoto Watanabe, Kodaira-shi, Hisakazu Mukai, Musashino-shi, and Keisuke Kataoka, Nerima-ku, Tokyo, Japan, assignors to Nippon Telegraph and Telephone Public Corporation, Musashino-shi, Tokyo, Japan, a corporation of Japan Filed Feb. 14, 1967, Ser. No. 616,045

Claims priority, application Japan, Feb. 16, 1966, 41/8,890; Apr. 11, 1966, 41/22,435; May 23, 1966, 41/32,505

Int. Cl. H03k *17/00*

U.S. Cl. 307—248 6 Claims

ABSTRACT OF THE DISCLOSURE

A high speed semiconductor switching circuitry having an emitter grounded transistor inverter, a driving circuit to drive the transistor inverter and an auxiliary control circuit connected between the driving circuit and the output terminal of the transistor inverter. The auxiliary control circuit comprises a sub-driver circuit including at least one PN junction which is able to carry the forward current toward the driving circuit as viewed from a source of supply and a circuit to transfer the potential at the output terminal of the transistor inverter to the sub-driver circuit with a certain level shift which is proportional to the PN junction contact potential and functions to increase the driving current supplied to the transistor inverter via the driving circuit during forward recovery period in which the transistor inverter is switched from nonconducting state to conducting state whereby decreasing power consumption of the circuitry and increasing the switching speed of the transistor inverter.

BACKGROUND OF THE INVENTION

Figures 1, 2, 3, 4:
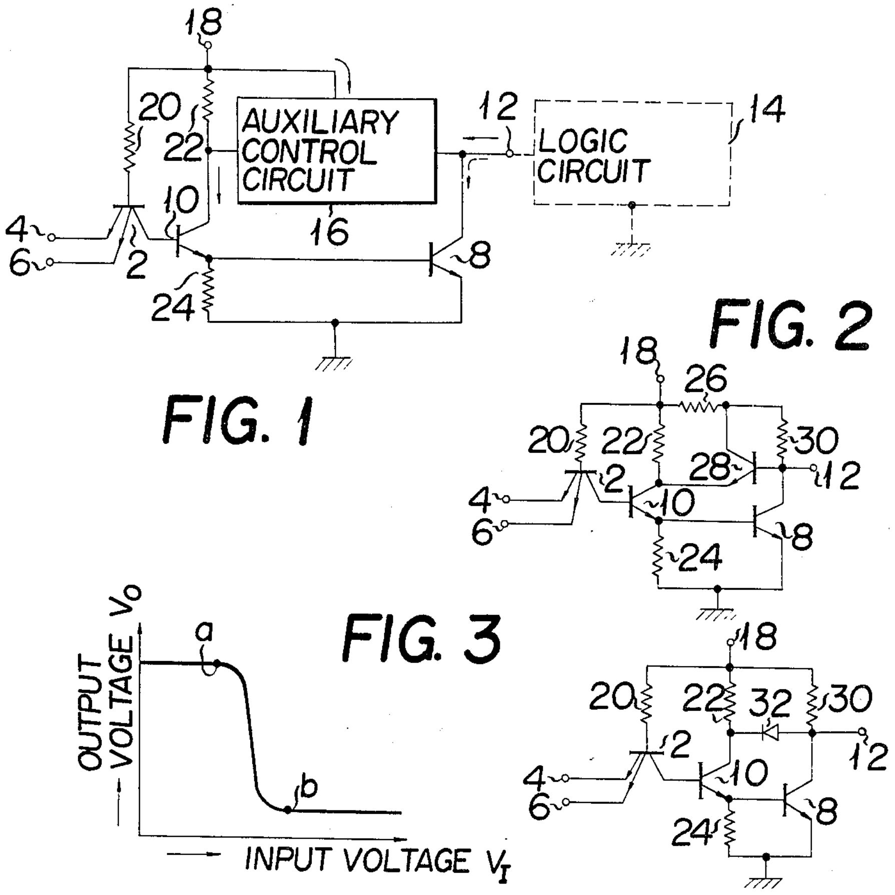

This invention relates to a switching circuit utilized as a logic circuit, and more particularly to a high speed semiconductor switching circuitry utilizing an emitter grounded transistor inverter.

As one of various basic forms of logic circuits there is a circuit generally designated as a NOT circuit or an inverter. A NAND circuit and a NOR circuit respectively consisting of combinations of NOT and AND circuits and NOT and OR circuits are generally used as the basic units of logic circuits.

Considering now a NAND circuit as the typical one of prior logic circuits employing a transistor inverter, a NOT circuit or a transistor inverter comprises an NPN type transistor with its emitter electrode grounded and its collector electrode connected to an output terminal. The transistor inverter is driven by a driving circuit including a driver transistor provided in the preceding stage thereof and connected in an emitter follower fashion. The driving circuit functions to amplify a current from an AND gate utilizing a transistor of multiple emitter construction provided in the preceding stage and to supply the amplified current to the base electrode of the transistor inverter followed by switching it from the nonconducting state to the conducting state.

In this manner, when all input terminals provided for respective one of the multiple emitters of the AND gate are brought to a high "1" level potential by the action of an input signal, electric current supplied to the base electrode of the AND gate transistor from a source of supply will be caused to flow into the base electrode of the driver transistor through the collector electrode of said AND gate transistor. This current will then be amplified by the driver transistor and supplied to the base electrode of the transistor inverter to switch it from the nonconducting state to the conducting state.

With the circuits described above, when either one or more of the input terminals assume a low "0" level potential, the current flowing into the base electrode of the AND gate transistor will flow to the multiple emitters or input terminals which are maintained at a potential lower than that of the base electrode. As a consequence no current will be supplied to the base electrode of the driver transistor and hence the driving current to the transistor inverter will be interrupted to switch the transistor inverter from the conducting state to the nonconducting state.

In order that the transistor inverter may rapidly switch from the conducting to nonconducting state, the electric charge stored in the base region of the transistor composing the inverter is required to be quickly discharged through the base resistor.

Thus in order to decrease the switching time by decreasing the recovery time required for discharging electric charge stored in the base region it is necessary to decrease the resistance value of said base resistor. However, such decrease in the value of the base resistor will cause the driving current flowing into the base electrode of the transistor which composes the inverter to drive the transistor inverter to divert in vain through the base resistor. Accordingly, it becomes necessary to pass surplus driving current through the driver transistor in order to compensate said diverted current. Thus, there results an increase in the power consumption of the circuit in order to decrease the switching time.

Further it is necessary to design such that the driving current supplied to the transistor inverter should be sufficiently high enough to maintain the transistor inverter in the conducting state even when the number of logic circuits composing the load connected to the output terminal is increased to a maximum number. However, in the actual circuit, the number of logic circuits which are connected to one logic circuit as its load is generally far smaller than the maximum number of permissible in the design of the logic circuit. As a consequence, most logic circuits are generally designed to be supplied with a driving current larger than that actually required.

Supply of surplus driving current to the transistor inverter results not only in excessive power consumption but also in the increase of the electric charge accumulated in the base region of the transistor inverter followed by which results in increasing the switching time of said transistor inverter.

According to this invention, a current larger than the steady state current is supplied during the forward recovery period in which the transistor inverter is switched to the conducting state whereby a required minimum current is caused to flow in the steady state decreasing the power consumption of the circuitry. With this arrangement since it is possible to decrease the resistance value of the base resistor of the transistor inverter, the recovery switching period can also be decreased.

SUMMARY

The invention provides a high speed semiconductor switching circuitry comprising an emitter grounded transistor inverter, a driving circuit for driving the transistor inverter and an auxiliary control circuit connected between the driving circuit and the output terminal of the transistor inverter. The auxiliary control circuit includes a subdriver circuit consisting of a semiconductor element having at least one PN junction which is able to carry the forward current toward the driving circuit as viewed from a source of supply and a circuit to transfer the potential at the output terminal of the transistor inverter to the sub-driver circuit with a certain level shift which is proportional to the PN junction contact potential whereby increasing the driving current supplied to the transistor inverter through the driving circuit during the forward recovery period to switch the transistor inverter from nonconducting state to conducting state.

For this reason it is possible to supply a large current to the transistor inverter in the recovery state without increasing the power consumption in the steady state thereby enabling to increase the switching speed both for resistive load and for capacitive load. In the steady state of inverter transistor, the sub-driver circuit can provide small driving current to the transistor controlled by the output potential through the level shifting means. In addition, it is possible to vary the driving current in response to the load of the transistor inverter so that it is able to provide a circuitry capable of supplying the required minimum sufficient quantity of the driving current in the steady state condition under any load condition.

Figure 5:
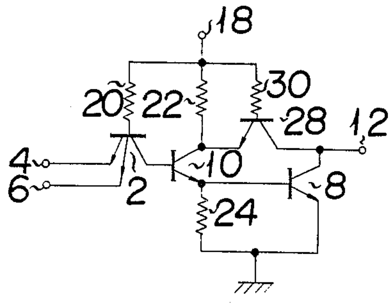

In the drawings:

FIG. 1 of the accompanying drawings shows a connection diagram of one example of the circuitry constructed in accordance with this invention;

FIGS. 2, 4, and 5 show examples of practical circuits employing the circuitry shown in FIG. 1;

FIG. 3 is a graph illustrating the relation between input and output voltages of a NAND gate circuit; and FIGS. 6 to 17 inclusive show connection diagrams of other different modifications of this invention.

DESCRIPTION OF THE PREFERRED EMBODIMENTS

Referring now to FIG. 1 of the accompanying drawings which illustrates a circuit arrangement of one embodiment of this invention wherein the invention is applied to a NAND circuit there is shown an AND gate circuit consisting of an NPN type transistor 2 of the multiple emitter construction. The transistor 2 is provided with a plurality of, for example two, emitters connected to input terminals 4 and 6, respectively. Further, an emitter grounded NPN type transistor 8 is provided to compose a NOT circuit of an transistor inverter, said inverter transistor 8 being preceded by a stage including a driving circuit or an emitter follower circuit composed by an NPN type transitsor 10. The collector electrode of the inverter transistor 8 is connected to a lead terminal 12 connected to a logic circuit 14 acting as a load and represented by a dashed line.

According to this invention there is also provided an auxiliary control circuit 16 between the collector electrode of the driver transistor 10 and the collector electrode of the inverter transistor 8. The auxiliary control circuit 16 comprises a sub-driver circuit including at least one PN junction which is able to carry the forward current toward the driver transistor 10 as viewed from a source terminal 18 and a circuit adapted to transfer the potential of the output terminal of the inverter transistor 8 to the sub-driver circuit with a certain level shift which is proportional to the PN junction contact potential.

In operation, when a low voltage of "0" level is impressed upon at least one of the emitter terminals 4 and 6 of the multiple emitter transistor 2 composing the AND gate circuit while a suitable positive voltage is being applied to the source terminal 18, a large current would flow through its emitter electrode through a resistor 20 so that the potential of the base electrode of the driver transistor 10 that composes the emitter follower circuit will become substantially equal to the ground potential, then the driver transistor 10 is turned to the nonconductive state. As a consequence, the base electrode of the inverter transistor composing the inverter circuit will also assume the ground potential whereby the inverter transistor 8 is turned off with the result that a positive voltage substantially equal to that of the supply terminal or a voltage of "1" level appears at the output terminal. When the voltage of "1" level is impressed upon both terminals 4 and 6, a current will flow into the base electrode of the driver transistor 10 through resistor 20 so that the driver transistor 10 is turned on and the voltage drop across the resistor 24 is impressed upon the base electrode of the inverter transistor 8. Thus, this transistor too is rendered conductive to supply a low voltage of "0" level to the output terminal 12. While the AND gate circuit may be constituted by any other suitable circuits or diodes, in accordance with this invention there is inserted an auxiliary control circuit 16 between the collector electrode of its driver transistor 10 and the collector electrode of the inverter transistor 8, said auxiliary control circuit 16 becoming highly conductive when the relative voltage of the collector of the driver transistor 10 to the collector of the inverter transistor 8 is smaller than a predetermined voltage determined by the level shifting means.

Thus, when a signal of "1" level is applied to both input terminals 4 and 6 to turn the inverter transistor 8 to the conducting state from the nonconducting state, driver transistor 10 becomes conducting first and inverter transistor 8 turns on after a slight time lag so that the sub-driver circuit included in the auxiliary control circuit is rendered conductive during this forward recovery switching period.

However, when the inverter transistor 8 becomes perfectly conductive, the sub-driver circuit will return to the nonconductive or slightly conductive state. In this manner, only during the forward recovery switching period of the inverter transistor 8 a large current flows into the collector electrode of the driver transistor 10 from supply terminal 18, and this current further flows to the base electrode of the inverter transistor 8 through the collector electrode of the driver transistor 10 thus greatly increasing the forward recovery switching period of the inverter transistor 8. Consequently, by selecting the small value of the base resistor 24 of the inverter transistor 8, the reverse recovery period can also be made sufficiently short. Furthermore, in the case where the inverter transistor 8 is in the steady conducting state, the driving current from the sub-driver circuit can be maintained at a small value controlled by the collector voltage of the inverter transistor 8, namely load current, thus allowing the average power consumption to be small. In this instance, the base current of the inverter transistor 8 is controlled by the load current, namely, the collector current of inverter transistor 8. The excess charge stored in the base is maintained to have small value. In other words, the inverter transistor 8 is controlled to be in the slightly saturated condition. Therefore, the reverse recovery time required for the inverter transistor 8 to switch from the conducting state to the non-conducting state is further greatly reduced. When in accomplishing the above functions the level shift of the circuit transmitting output potential to the sub-driver comprising a PN junction is determined by the reference level of the forward voltage drop of a PN junction, the control of the output voltage and consequently the control of the saturation of the inverter transistor 8 can be executed with high precision, irrespective of the variations in operating temperature and the power source voltage.

In the arrangement shown in FIG. 2, the auxiliary control circuit 16 is composed by connecting a sub-driver transistor 28 between a supply terminal 18 and the collector electrode of a driver transistor 10 via a resistor 26 and by connecting the base electrode of the sub-driver transistor to the collector electrode of the inverter transistor 8. In the following description, all elements or components identical to those shown in FIG. 1 are designated by the same reference numerals. When a voltage of "1" level is impressed upon both input terminals 4 and 6 while a voltage of "1" level is appearing at the output terminal 12, the driver transistor 10 will be turned on. At this time, however, as a positive voltage substantially equal to that applied to supply terminal 18 appears at the output terminal 12, a sub-driver transistor 28 also becomes conductive to pass a large current to driver transistor 10 through the resistor 26 and the sub-driver transistor 28. As a consequence a large current will flow into the base electrode of inverter transistor 8, the inverter transistor 8 is rapidly turned to the conducting state whereby a voltage of "0" level will appear at the output terminal 12. Further, such decrease in the voltage of terminal 12 causes the sub-driver transistor 28 to turn off to decrease the current through the driver transistor 10 whereby the current through the terminal 12 is caused to flow only through the inverter transistor 8. Since the relation between the voltage at input terminals 4 and 6 and the voltage at the output terminal 12 is represented by a curve as shown in FIG. 3, the sub-driver transistor 28 becomes conductive only during a period between points *a* and *b* to increase the current through driver transistor 10. By this reason the forward recovery period of the inverter transistor 8 is decreased.

FIG. 4 shows a modified embodiment wherein the auxiliary control circuit shown in FIG. 1 is composed by inserting a sub-driver diode 32 between the collector electrode of an inverter transistor 8 and the collector electrode of a driver transistor 10. With this arrangement when the collector potential of the driver transistor 10 decreases during the forward recovery period a current will flow into the sub-driver diode 32 through the terminal 12 and through the resistor 30. As this current causes to increase the current through driver transistor 10, the inverter transistor 8 is quickly turned on to decrease the voltage of terminal 12. This decrease in the voltage of terminal 12 also causes subdriver diode 32 to turn off to stabilize the current through driver transistor 10 to be in the steady state. With this circuit arrangement as a current flows into sub-driver diode 32 from a load circuit not shown in the drawing during the forward recovery period the base current of the inverter transistor 8 increases with the increase in load. As a result, it is possible to prevent degrading of the forward recovery characteristics due to load increase.

FIG. 5 represents another modification by which the current supplied from a load circuit to a driver transistor 10 during the forward recovery period is further increased. More particularly, a sub-driver transistor 28 is interposed between collector electrodes of transistors 8 and 10 and a resistor 30 is connected between the base electrode of sub-driver transistor 28 and a supply terminal 18 so that when driver transistor 10 becomes conductive a current will flow to driver transistor 10 from the supply terminal 18 through the resistor 30 and base-emitter path of the sub-driver transistor 28. This turns on the sub-driver transistor 28 to pass current to the driver transistor 10 from a not shown load circuit connected to the output terminal 12. Further when the inverter transistor 8 becomes conductive the current through the resistor 30 will flow to the inverter transistor 8 through the collector electrode of sub-driver transistor 28, and the inverter transistor is turned off. With this circuit arrangement also, as the current flowing to the driver transistor 10 from the terminal 12 increases with load it is possible to prevent variations in the forward recovery period of the inverter transistor 8 owing to load change. Further, as the voltage at the terminal 12 decreases when current is supplied to the sub-driver transistor 28 from the terminal 22, the recovery period is decreased further by said voltage drop. It is also possible to supply charging current to a capacitive load through the sub-driver transistor 28 during the reverse recovery period of the inverter transistor 8 by increasing the reverse current amplification factor of the sub-driver transistor 28.

Figure 6:
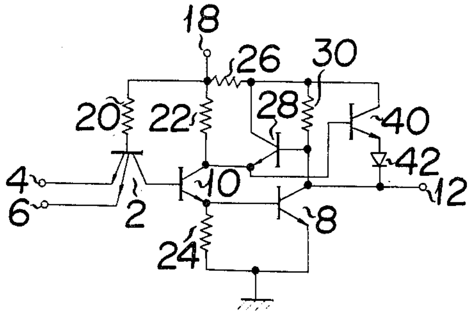

In still further modification shown in Fig. 6 a series circuit including a transistor 40 and a diode 42 is connected between the junction between resistors 26 and 30 and the collector electrode of the inverter transistor 8, and the base electrode of the diode 42 is connected to the collector electrode of the driver transistor 10. With this circuit arrangement, upon conduction of the driver transistor 10 during the reverse recovery period the transistor 40 will become conductive whereby a large charging current can be supplied to a capacitive load through transistor 40 and diode 42. However, under the steady state condition the transistor 40 becomes nonconductive, thus avoiding any effect to the circuit current.

As can be clearly noted from above description regarding foregoing embodiments the NAND gate circuit constructed according to the principle of this invention functions to increase the input current to the inverter transistor only during the recovery period in which the inverter transistor is switched to conductive state from nonconductive state thus greatly decreasing the forward recovery period. Further, concurrently with the operation of a driver transistor or prior to the operation of the inverter transistor a current flows into the driver transistor from the load circuit through the output terminal so that the voltage of the output terminal is decreased by that current. This also contributes to the reduction of the pulse response time. Further, since it is possible to greatly increase the base current of the inverter transistor 8 during the forward recovery period as above described it is possible to select sufficiently small value of base resistor of the inverter transistor. Consequently, during the reverse recovery period, current carriers in the inverter transistor discharge rapidly through said resistor to also decrease the reverse recovery period. Further, as it is possible to sufficiently decrease the forward recovery period it is not necessary to increase the degree of saturation of the inverter transistor during steady state operation, and the base current of the inverter transistor can be decreased. This causes not only in the reduction of the power consumption of the circuit arrangement as a whole but also in the reduction of the number of current carriers in the base region of inverter transistor and these reductions contribute to the further reduction of the reverse recovery period. Further, during the forward recovery period, as the collector load resistance of the driver transistor is decreased, the current gain thereof is greatly increased. By these reasons the invention is extremely advantageous in that the slope of the characteristic curve shown in FIG. 3 becomes very steep between points *a* and *b* and that noise allowance is also increased.

Figure 7:
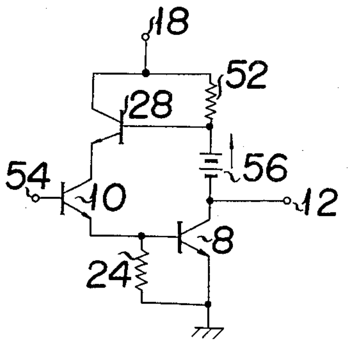

FIG. 7 illustrates still further modification of the auxiliary control circuit 16 which comprises a sub-driver transistor 28, a battery 56 for providing a suitable potential difference $V_D$ and a resistor 52. The base potential of the sub-driver transistor 28 is determined by the collector potential of the inverter transistor 8 or the potential appearing at the output terminal 12 and the potential of the battery 56 whereas the emitter potential of the sub-driver transistor 28 is the same as the collector potential of the driver transistor 10 included in the preceding stage. As a result, when an input current is supplied to the input terminal 54 and when both transistors 8 and 10 are in their conductive condition, the sub-driver transistor 28 will operate automatically in the case where the output potential tends to vary in response to the load connected to the output terminal 12, whereby to vary the collector current of the driver transistor 10, in other words to vary the current gain thereof thus maintaining the output potential at a constant value. In this case it is possible to set the value of the output potential to any sutiable value by proper selection of the collector potential of the driver transistor 10 and the potential difference $V_D$ afforded by battery 56. Thus, during the conducting state of inverter transistor 8, it is possible to maintain the inverter transistor 8 in any desired conducting state in the range from its deep saturation state to its nonsaturation state, particularly in a slight saturation state. This is very advantageous for the switching operation of the transistor because in a slight saturation state, the "0" level potential of the output terminal 12 can be maintained at a value comparable with that in a deep saturation state and because the reverse recovery period at the time of switching, the inverter transistor 8 is short which is comparable with that of non-saturation state. In the circuit arrangement shown in FIG. 7 it is necessary to make the value of the potential difference $V_D$ smaller than the sum of the collector potential of the driver transistor 10 and the emitter junction potential difference of the sub-driver transistor 28. Otherwise the above mentioned effect of the sub-driver transistor would be lost so that a large current may flow into the base electrode of the inverter transistor 8 through sub-driver transistor 28 thus greatly increasing power consumption.

Further, with the circuit arrangement shown in FIG. 7, during the recovery period wherein the circuitry is switched from the no input state to the current carrying state by being supplied with drive current at input terminal 54, the sub-driver transistor 28 operates to pass a large current to the collector electrode of the driver transistor 10 during an interval from the operation of the driver transistor 10 in the preceding stage until the collector potential of the inverter transistor 8 drops to a steady potential. As a consequence the input current to the base electrode of inverter transistor 8 is increased to greatly reduce the recovery period. The embodiment of FIG. 7 may be modified by replacing the power source 56 with a diode to provide the desired result. Circuits with such diodes are discussed hereinbelow.

Figure 8:
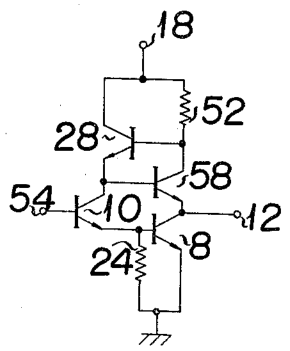

FIG. 8 illustrates a circuit arrangement of another example of the novel circuitry wherein the battery 56 in FIG. 7 is substituted by a transistor 58. Variation in the collector potential of the inverter transistor 8 results in the change in the operation of the transistor 58 and hence in the variation in the base potential of the sub-driver transistor 28. Thus, again an auxiliary control circuit is provided which functions in the similar manner as that shown in FIG. 7.

Figure 9:
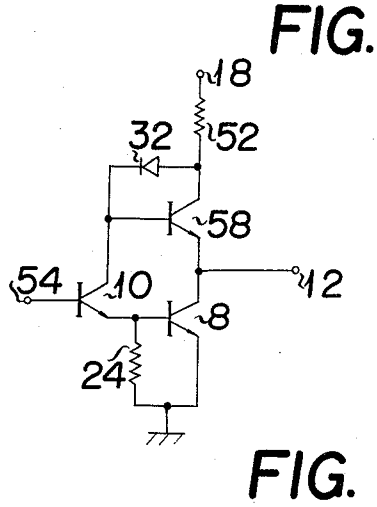

FIG. 9 shows the connection diagram of still another modification of this invention. In this case the sub-driver transistor 28 shown in FIG. 8 is substituted by a sub-driver diode 32 so that the collector current of transistor 58 is varied in response to the variation in the collector potential of the inverter transistor 8 to vary the current supplied to the base electrode thereof through the diode 32 and the driver transistor 10. These variations serve to maintain the collector potential of the inverter transistor 8 at a constant value.

Figure 10:
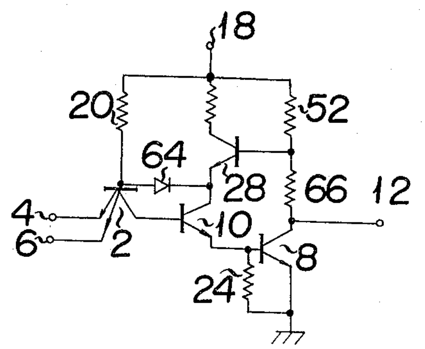

FIG. 10 shows one application of this invention wherein the novel circuitry is utilized as an inverter and the inverter is combined with an AND gate circuit of the multiple emitter construction to form a NAND logic gate circuit of a transistor-transistor logic circuit. In this case a clamping diode 64 is connected between the base electrode of a gate transistor 2 and the collector electrode of a driver transistor 10 whereby the collector potential of the driver transistor 10 is fixed to a point in the nonsaturated or slightly saturated range. In order to provide a potential difference corresponding to the potential difference $V_D$ afforded by the battery 56 shown in FIG. 7 a resistor 66 is used. As a result the collector potential of the inverter transistor 8 is determined to have a fixed value in accordance with the collector potential of the transistor as determined by the clamping diode 64 and the voltage drop across the resistor 52.

Figure 11:
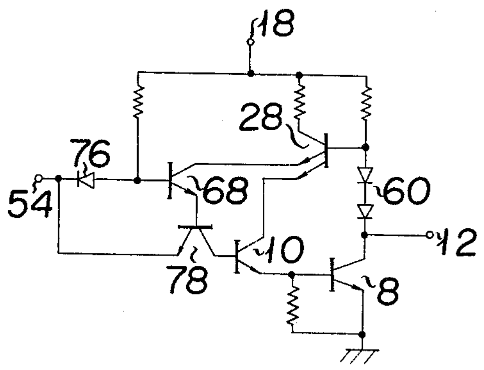

FIG. 11 shows another application of this invention wherein the novel circuitry is employed as an inverter and the inverter is combined with a diode gate circuit to form a diode-transistor logic gate circuit. In this figure numeral 76 designates a gate diode and numerals 68 and 10 designate driver transistors which also function to provide a level shift. The numeral 8 indicates an inverter transistor, 28 a sub-driver transistor, 60 a diode to obtain a constant bias voltage, and 78 a restoring transistor adapted to provide a by-path to discharge accumulated current carriers during the recovery period in which the circuitry is switched to the nonconducting state from the conducting state. In this circuit, two driver transistors 68 and 10 of the emitter follower connection type are employed in order to make a large level shift between the gate circuit and the inverter transistor. However the driver transistor 68 functions to effect current amplification due to the sub-driver effect of the sub-driver transistor 28 and the diode 60 only during the forward recovery period of the inverter transistor 8 and the auxiliary control circuit loop according to this invention is composed by diode 60, transistors 28, 10 and 8 under steady condition.

Figure 12:
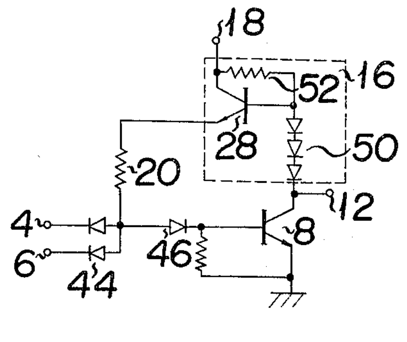

FIG. 12 shows an amplification of this invention to a diode-transistor logic circuit comprising an AND gate circuit utilizing a diode and an inverter circuit utilizing a transistor. Reference numeral 44 represents a gate diode and 46 a level shift diode. An output terminal of the AND gate circuit is provided at the connection point between the diodes 44 and 46. The auxiliary control circuit shown by a box 16 in FIG. 1 comprises a transistor 28, a resistor 52 and diodes 50. When a low "0" level voltage is impressed upon either one of two input terminals 4 and 6 a current will flow to the particular input terminal to which the "0" level voltage has been impressed from the supply terminal 18 through the sub-driver transistor 28 and the gate diode 44. However the inverter transistor 8 is in the nonconductive state to provide a high "1" level voltage to the output terminal 12.

When a high "1" level voltage is impressed upon both input terminals 4 and 6, the current which has been flown through the sub-driver transistor 28 is fed to the output terminal of diode AND gate through the resistor 20 and flow into the base electrode of the inverter transistor 8 through diode 46 to turn it on. If the base input current of the inverter transistor 8 is excessive when compared with the collector current of the inverter transistor 8 supplied from a load connected to the output terminal 12 the collector voltage of the transistor is reduced excessively. Then this voltage will be transferred to the base electrode of the sub-driver transistor 28 via diodes 50 to limit the current supplied to the base electrode of the inverter transistor 8 from the sub-driver transistor 28 via the resistor 20. By this reason the inverter transistor 8 is always supplied with a base input current corresponding to the load current to maintain the voltage at the output terminal 12 at a constant value. This arrangement permits to limit to the required minimum quantity the power consumption in the circuit which is necessary to drive the inverter transistor 8 under steady state condition. Further, during the recovery period during which the circuitry reaches the steady conduction state, as a current determined by the resistor 20 alone flows directly into the base electrode of the inverter transistor 8 it is possible to drive the same by a relatively large current followed by decreasing the recovery period required to reach the steady conduction state.

Figure 13:
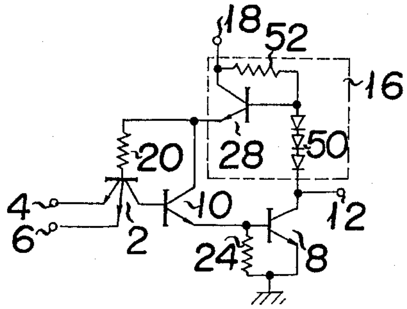

FIG. 13 illustrates this invention as applied to a transistor-transistor logic circuit. With the embodiment shown in FIG. 12 the current flowing into the base electrode of the inverter transistor 8 is determined by the value of resistor 20 so that it is impossible to make said base current larger than the current which flows out from the input terminal when a low "0" level voltage is applied to at least one of the input terminals 4 and 6. Thus, the number of output load circuits that can be connected as well as the current which drives the inverter transistor 8 during the recovery period are limited.

Whereas in the embodiment shown in FIG. 13, while the current that flows through the input terminal when a low "0" level voltage is applied to at least one of the input terminals 4 and 6 is determined by the resistor 20 it is possible to greatly increase the driving current for the inverter transistor 8 while it is conducting state by the driving action of transistors 28 and 10. In this case the collector voltage of the driver transistor 10 is the same as the voltage appearing at one terminal of the resistor 20 connected to the base electrode of the transistor 2 so that the driver transistor 10 is maintained in a nonsaturated condition. The current supplied by the emitter electrode of the sub-driver transistor 28 that comprises the auxiliary control circuit flows to the base electrode of the driver transistor 10 through the resistor 20 and to the collector electrode of the driver transistor 10, the collector current thereof being determined by the current flowing through the resistor 20 multiplied by the current amplification factor of the driver transistor 10. The total current supplied from the emitter electrode of the transistor 28 and fed to the base electrode of the transistor 2 and to the collector electrode of the driver transistor 10 is controlled by the auxiliary control circuit in response to the load current of the inverter transistor 8 and because it is possible to make its maximum value to be equal to the product of the current flowing through the resistor 52 and the current amplification factor of the sub-driver transistor 28, even when the number of load circuits to be connected to the output terminal 12 is increased it is still possible to supply to the inverter transistor 8 a sufficient base current required for these numbers of load circuits. In this manner, with the embodiment shown in FIG. 3 it is possible to drive the circuit with the minimum required power over a wide range of the number of load circuit. Further, the sub-driver transistor 28 is always in conductive state whether a sufficiently low voltage of "0" level is impressed upon at least one of the input terminals 4 and 6 or a sufficiently high voltage of "1" level is impressed upon both input terminals 4 and 6 so that it is possible to supply to the base electrode of the inverter transistor 8 a large current by the sub-driver transistor 28 during the forward recovery period during which the inverter transistor 8 is switched to the conducting state from the non-conducting state, thus greatly decreasing said forward recovery period.

Figure 14:
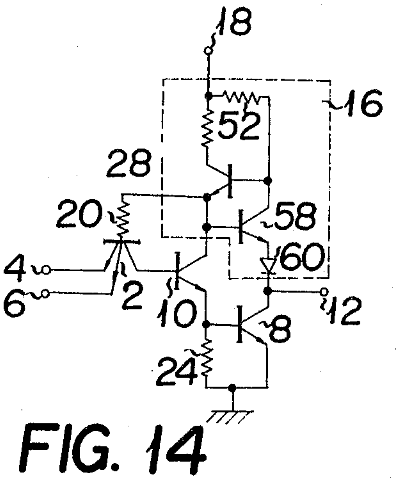

FIG. 14 illustrates another embodiment of this invention wherein the diodes 50 employed in the embodiment shown in FIG. 13 are replaced by a transistor 58 and a diode 60 which function to control the current supplied to transistors 2 and 10 from the sub-driver transistor 28.

Figure 15:
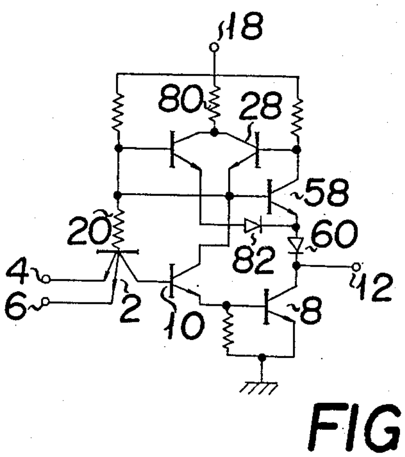
Figure 16:
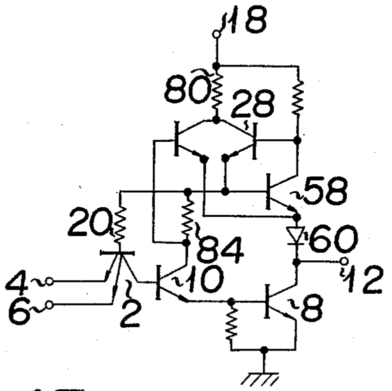

FIGS. 15 and 16 illustrate NAND gate circuits in which a transistor 80 for charging capacitive loads during the reverse recovery period of the inverter transistor 8 is incorporated into the embodiment shown in FIG. 14. In the embodiment shown in FIG. 15 a diode 82 is connected between the transistor 80 and a diode 60 to prevent transistor 80 from conducting during steady state operation. Whereas in the embodiment shown in FIG. 16 a resistor 84 is connected to the collector electrode of the driver transistor 10 to maintain the same in a saturated conducting condition whereby the collector voltage thereof is decreased to prevent the conduction of the transistor 80 connected thereto.

Figure 17:
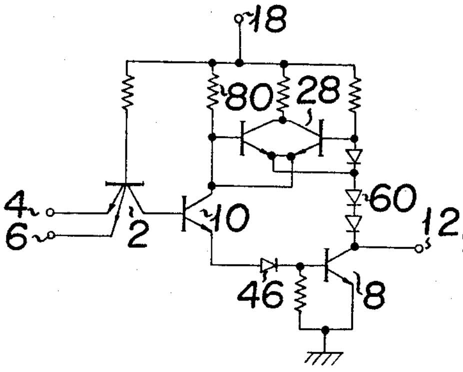

FIG. 17 shows another example wherein the invention is applied to a transistor-transistor logic gate circuit. In this circuit a diode 46 is connected between a driver transistor 10 and an inverter transistor 8 to increase the level shift between the gate circuit and the inverter transistor 8. In addition, a transistor 80 is added to supply a current for charging a capacitive load during the reverse recovery period of the inverter transistor 8.

Figure 18:
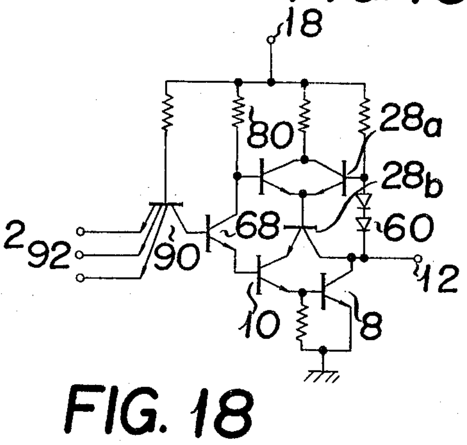

FIG. 18 illustrates still another example wherein the invention is applied to a transistor-transistor logic gate circuit. In this circuit, sub-driver transistors **28*a* and 28*b* are utilized in the auxiliary control circuit. With this circuit arrangement a base current is supplied to sub-driver transistor 28*b* from sub-driver transistor 28*a* in response to the collector potential of the inverter transistor 8 transferred through diodes 60. This base current is then selectively supplied to the emitter or collector electrode of the driver transistor 10 in accordance with the relative magnitude of the collector potential of the driver transistor 10 and the collector potential of the inverter transistor 8. More particularly, where the load current of the inverter transistor 8 is high and hence the collector potential is high, a correspondingly large current will be supplied to the collector electrode of the driver transistor 10 and hence to the base electrode of the inverter transistor 8 through emitter electrodes of sub-driver transistors 28*a* and 28*b* thus maintaining constant the collector potential. During the recovery period in which the input potential applied to the input terminal 92 of the gate circuit varies from a high "1" level to a low "0" level and the inverter transistor 8 is switched from the nonconducting state to the conducting state there exists a large potential difference between collector electrodes of driver transistor 10 and of inverter transistor 8 whereby the sub-driver transistor 28*a* functions to supply a large current. At this time this transistor 28*a* draws current from the load connected to the output terminal 12 to supply it to the base electrode of the inverter transistor 8 via the sub-driver transistor 28*a*** so that the recovery period of the transistor is further decreased.

While the invention has been shown and described in terms of preferred embodiments thereof it should be understood that the invention is by no means limited to these particular embodiments and that many changes and modifications may be made without departing from the true spirit and scope of the invention as defined in the appended claims.

What is claimed is:

1. A high speed semiconductor switching circuit comprising:
- an emitter grounded inverter transistor circuit;
- a driving circuit including at least a first PN junction element for transmitting an amplified input signal to the base eletrode of said inverter transistor circuit, said inverter transistor circuit providing at its collector electrode an output signal;
- a controlled current supply circuit including a second PN junction element coupled between said collector electrode of said inverter transistor circuit and said driving circuit for supplying controlled driving current to said driving circuit, said controlled current being controlled by the collector voltage of said inverter transistor; and
- a constant voltage circuit including a third PN junction element coupled between said controlled current supply circuit and the collector electrode of said inverter transistor circuit for coupling the collector voltage of said inverter transistor circuit, shifted in level, to said controlled current supply circuit, the magnitude of said level shift being a function of the forward voltage drop of said third PN junction element.

2. Switching circuit according to claim 1 wherein said third PN junction element comprises at least a first diode.

3. Switching circuit according to claim 2 wherein said third PN junction circuit includes at least a second diode series coupled with said first diode.

4. Switching circuit according to claim 1 wherein said third PN junction element includes:
- a transistor, the base electrode of said transistor being connected to said driving circuit, the emitter electrode of said transistor being coupled to the collector electrode of said inverter transistor circuit and the collector electrode of said transistor being coupled to said controlled current supply circuit.

5. Switching circuit according to claim 1 wherein said second PN junction element includes a diode.

6. Switching circuit according to claim 4 wherein said constant voltage circuit further includes at least one diode series coupled with the emitter electrode of the transistor which comprises said third PN junction.

References Cited

UNITED STATES PATENTS

| | | | |
|---|---|---|---|
| 3,439,184 | 4/1969 | Seelbach | 307—215 X |
| 3,083,303 | 3/1963 | Knowles et al. | 307—215 |
| 3,394,268 | 7/1968 | Murphy | 307—215 |
| 3,418,492 | 12/1968 | Lin | 307—214 |
| 3,427,474 | 2/1968 | Chua | 307—215 X |

OTHER REFERENCES

Gillett, I.B.M. Technical Disclosure Bulletin, vol. 7, No. 6, 11–66 (P. 440).

JOHN S. HEYMAN, Primary Examiner

U.S. Cl. X.R.

307—214, 215, 218